STABILIZED TRANSISTOR SIGNAL AMPLIFIER CIRCUIT
Filed Feb. 27, 1956
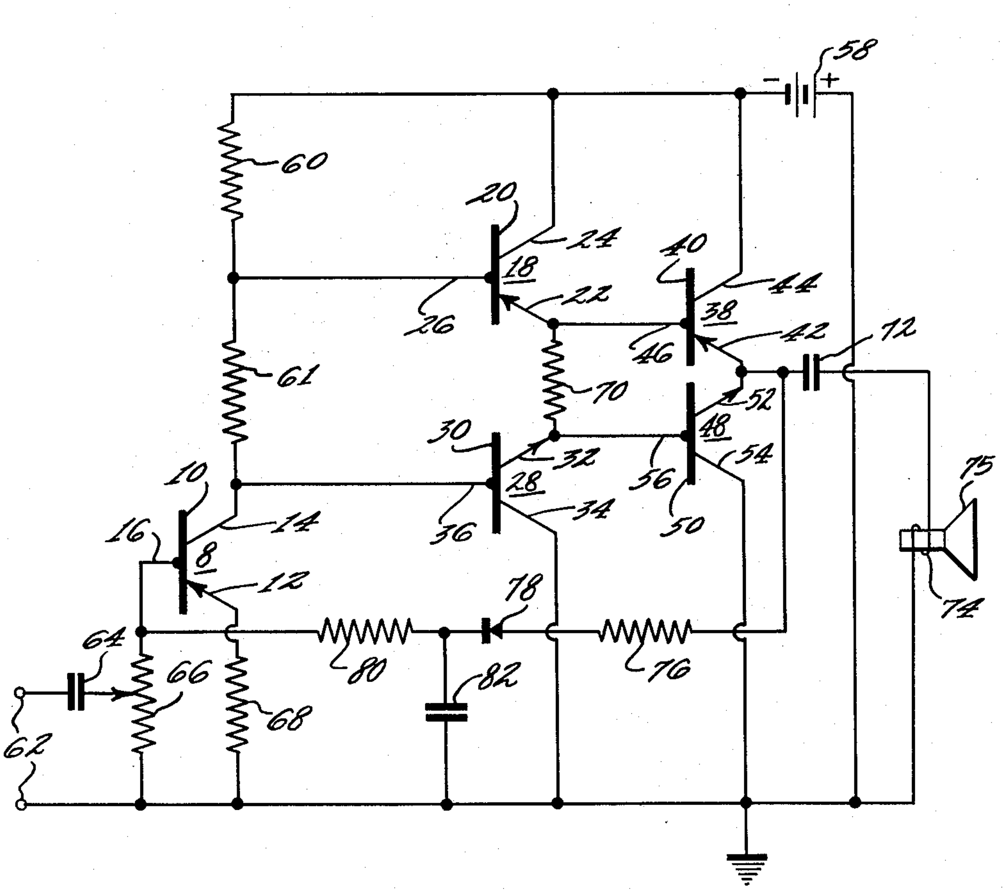
INVENTOR.
Albert I. Aronson
BY H. W. Newton
ATTORNEY.

United States Patent Office 2,847,519

Patented Aug. 12, 1958

2,847,519

STABILIZED TRANSISTOR SIGNAL AMPLIFIER CIRCUIT

Albert I. Aronson, Collingswood, N. J., assignor to Radio Corporation of America, a corporation of Delaware Application February 27, 1956, Serial No. 567,831

2 Claims. (Cl. 179—171)

This invention relates in general to signal amplifier circuits and in particular to stabilized signal amplifier circuits utilizing semi-conductor amplifier devices such as transistors.

One of the problems incident to the design of signal amplifier circuits in which transistors are used as active signal amplifying elements is that the direct current operating point of a transistor may tend to shift with variations in ambient temperature. The characteristics of transistors may also vary appreciably from one unit to another, even though an effort is made to make them identical with each other. Accordingly, a circuit which has been adjusted to operate satisfactorily with one transistor may often be found to require readjustment for satisfactory operation with another transistor. One method for accomplishing operating point stabilization is to connect a feedback resistor between the collector and base electrodes of a transistor and provide energizing currents to the collector and emitter from a direct current source having a relatively high internal resistance. Collector voltage variations then vary the amount of bias current supplied to the base electrode in such a direction to reduce the collector voltage variations. This type of stabilization may be referred to as collector-to-base negative feedback.

For some circuit applications, collector-to-base negative feedback stabilization may not be entirely satisfactory because of distortion and other considerations. As an example, in some types of power amplifier circuits utilizing transistors, the use of collector-to-base negative feedback may not provide rigid enough control of the direct current operating point. A specific example of this type circuit is one in which a Class B push-pull output stage is driven by two transistors arranged as a Class B driver stage. A second driver stage precedes the Class B driver and may comprise a single transistor connected for Class A signal amplifying operation. In such a circuit, it is preferable to use a single supply of direct current voltage. To permit this, the voltage at two of the electrodes, for example, the collector and the emitter electrodes of the Class A driver transistor, is used to bias the transistors in the second driver and output stages. If this type of circuit is used, variations in the collector voltage of the Class A driver transistor will adversely affect the circuit operation. For this reason, it is important to maintain the collector voltage of the driver transistor at a substantially constant value.

It is, accordingly, an object of the present invention to provide an improved transistor signal amplifier circuit which is stable and reliable in operation.

It is another object of the present invention to provide improved means for stabilizing the circuit operation of a multi-stage transistor power amplifier circuit with variations in temperature or with variations in transistor operating characteristics.

It is a still further object of the present invention to provide an improved multi-stage transistor power amplifier having variable bias current supply means for the driver stage transistor thereof for effecting stable and substantially distortion-free circuit operation.

In accordance with the present invention, stabilization of the operating point of the driver stage transistor of a power amplifier circuit of the type described is provided by a direct current feedback connection from the output or emitter electrodes of the output stage transistors to the input or base electrode of the driver stage transistor. The feedback circuit contains direct current conductive means such as a semi-conductor avalanche diode which has a relatively low dynamic impedance and provides a voltage drop in response to current flow in excess of the product of the current flow and the dynamic resistance. By this type of feedback, variations in the collector voltage of the driver stage transistor are reflected in the output circuit of the push-pull output stage to provide a base bias current for the driver stage transistor which compensates for the undesired collector voltage variations.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

The single figure is a schematic circuit diagram of a transistor amplifier circuit embodying the invention.

Referring now to the drawing, a three-stage power amplifier circuit embodying the invention includes a first driver stage comprising a transistor 8, a second driver stage comprising two transistors 18 and 28, and a push-pull output stage comprising a pair of transistors 38 and 48. The driver transistor 8 may be considered to be of the P–N–P junction type and includes a semi-conductive body 10 and three electrodes, which are designated as an emitter 12, a collector 14, and a base 16. The transistors 18 and 28 of the second driver stage are of opposite conductivity types and may be considered to be P–N–P and N–P–N junction transistors, respectively. The transistor 18 includes a semi-conductive body 20 and an emitter 22, a collector 24, and a base 26, while the transistor 28 includes a semi-conductive body 30 which is of an opposite conductivity type from the semi-conductive body 20 and an emitter 32, a collector 34, and a base 36. The transistors 38 and 48 of the push-pull output stage are also of opposite conductivity types and may be considered to be P–N–P and N–P–N junction transistors, respectively. The transistor 38 includes a semi-conductive body with which an emitter 42, a collector 44, and a base 46 are cooperatively associated, and the transistor 48 includes a semi-conductive body 50 with which an emitter 52, a collector 54, and a base 56 are cooperatively associated. It should be understood that the conductivity type of each of the transistors is for purposes of illustration only, and that each of the transistors could be reversed in conductivity if the polarity of the direct current supply source was also reversed.

To provide biasing potentials for the transistors, a direct current supply source of energizing potential is provided, which is illustrated as a battery 58, the positive terminal of which is connected to the amplifier ground. The negative terminal of the battery 58 is connected directly to the collectors 24 and 44 of the transistors 38 and 18, respectively, and through a pair of serially connected resistors 60 and 61 to the collector 14 of the driver transistor 8. It should be noted that the circuit parameters are chosen so that the output and second driver stages are operated Class B while the first driver transistor is operated Class A. The resistance of the resistor 61, which is connected between the base electrodes of the second driver stage transistors, is chosen to be relatively small and is used to develop a differential bias for the transistors 18 and 28 for reducing distortion. The resistor 61 may also be chosen if desired to have a negative temperature coefficient, a thermistor being an example of this type device.

Input signals are applied to the circuit through a pair of input terminals 62, one of which is grounded as shown. The ungrounded input terminal 62 is connected through a coupling capacitor 64 to the variable tap 65 of a potentiometer resistor 66. One terminal of the potentiometer resistor 66 is connected to ground and the other terminal is connected directly to the base 16 of the driver transistor 8. Variations of the position of the tap 65 provide volume adjustment for the amplifier circuit. The emitter 12 of the driver transistor 8 is grounded through a degenerative resistor 68 which serves to stabilize the circuit operation. The output or collector electrode 14 of the driver transistor 8 is connected directly to the base 36 of the transistor 28 of the second driver stage, and through the low resistance of the resistor 61 to the base 26 of the transistor 18 of the second driver stage.

The driver stage transistors 18 and 28 are connected for common collector operation and as explained above are operated Class B. The output or emitter electrodes 22 and 32 of these transistors are connected together through a resistor 70. The resistor 70 provides current feedback for the Class B driver transistors 18 and 28, thus providing an additional measure of stability. The emitter 22 of the transistor 18 is connected directly to the base 46 of the transistor 38 of the output stage, while the emitter 32 of the driver transistor 28 is connected directly to the base 56 of the transistor 48 of the output stage. The collector 34 of the transistor 28 is connected directly to ground as shown.

The transistors 38 and 48 of the output stage are also connected so that the output stage is operated as a common collector Class B amplifier. The emitters 42 and 52 of the transistors 38 and 48 are connected directly together and through a coupling capacitor 72 to the voice coil 74 of the loudspeaker 75 which, with the collector 54 of the transistor 48, is connected to amplifier circuit ground as shown. Signals in push-pull are thus derived in the output circuit and applied to the loudspeaker 75.

To provide the desired operating point stabilization in accordance with the invention, the emitters 42 and 52 of the output transistors 38 and 48 are connected through a serially connected first resistor 76, diode 78, and second resistor 80, to the base 16 of the driver transistor 8. The diode 78 is of the type having a low dynamic resistance compared with the voltage drop thereacross to the current flow therethrough. The diode 78 may, therefore, be considered to be a semi-conductor diode biased in the reverse direction in the region of breakdown, which is sometimes referred to as the avalanche breakdown region. The diode 78 may thus be referred to as an avalanche diode or, alternatively, as a Zenner diode. Because of the feedback circuit used, in accordance with the invention, the signal is easily bypassed. This is accomplished by connecting a capacitor 82 from the junction of the diode 78 and the resistor 80 to ground. It should be understood that the direct current stabilizing feedback circuit could be partially by-passed to provide negative signal feedback from the output transistors to the base 16 of the driver transistor 8 by connecting the capacitor 82 across the resistor 76 and the diode 78.

In operation, application of a signal to the input terminals 62 will provide amplified signal current flow in the collector 14 of the driver transistor 8. The amplified signal is applied to the base electrodes 26 and 36 of the Class B driver transistors 18 and 28. On negative half cycles of signal current flow in the collector 14, the P–N–P driver transistor 18 will conduct, while the N–P–N driver transistor 28 will be non-conductive. On positive half cycles, on the other hand, the P–N–P transistor 18 will be non-conductive, while the N–P–N transistor 28 will conduct. Accordingly, an output signal in push-pull will be applied to the base electrodes 46 and 56 of the output transistors 38 and 48 respectively, which will provide an amplified push-pull output signal.

If the voltage at the collector 14 of the driver transistor 8 varies for any reason, the circuit will, in accordance with the invention, automatically compensate for these variations. This is accomplished by the direct current feedback connection from the emitter electrodes of the output transistors 38 and 48 to the base 16 of the driver transistor 8. If, for example, the collector voltage on the driver transistor 8 varies, this voltage variation will also cause the voltage at the emitter electrodes 42 and 62 of the output transistors to vary. An increase in the collector voltage of the driver transistor 8, for example, will cause the voltage at the emitter electrodes 42 and 52 to increase, which will cause the base current flowing out of the base 16 of the driver transistor to increase. This will cause an increase in the collector current flow of the driver transistor 8, which causes a reduction in the collector voltage of the driver transistor 8.

For this feedback action to be most effective, the resistance in the feedback path should be as low as possible. The use of the semi-conductor diode 78 in the feedback path increases the series resistance very little, but by virtue of the voltage drop across the diode 78 permits the resistance values of the resistors 76 and 80 to be small, while still maintaining the proper amount of bias current. Accordingly, the circuit operation is effectively stabilized to provide stable and substantially distortion-free circuit operation.

While the invention has been illustrated with particularity in a three-stage amplifier circuit, it should be understood that it is adapted for use with a two-stage amplifier circuit. As an example, the load or loudspeaker 75 may be connected to the emitter electrodes of the driver transistors 18 and 28, which would then serve as an output stage in the same manner as the output stage transistors 38 and 48. The feedback stabilizing circuit comprising the resistors 76 and 80 and the diode 78 would, as described and shown, be connected between the emitters of the output stage transistors and the base of the driver transistor 8. Moreover, the stabilizing bias circuit could be connected from the emitters of the transistors 18 and 28 to the base 16 of the first driver transistor 8 in the three-stage circuit illustrated. In a three-stage amplifier circuit of this type, however, it is preferable to connect the stabilizing circuit as shown, that is, between the emitters of the output transistors and the base of the first driver transistor.

While it will be understood that the circuit specifications may vary according to the design for any particular application, the following circuit specifications are included by way of example only:

| | |
|---|---|
| Battery 58 | 32 volts. |
| Resistors 60, 61, 66, 68, 70, 76, and 80 | 3900; 100; 10,000; 68; 82; 3300; and 15,000 ohms, respectively. |
| Capacitors 64, 72, and 82 | 10; 500; and 1.0 microfarads, respectively. |
| Diode 78 | Breakdown voltage, approximately 13 volts D. C. |

As described herein, a transistor signal amplifier circuit embodying the invention is capable of stable and satisfactory operation without adjustment even though transistors having widely different characteristics are used interchangeably or despite variations in temperature.

What is claimed is:

1. A signal amplifier circuit comprising, in combination, a first driver stage including a first transistor of one conductivity type having base, emitter, and collector electrodes; means for applying an input signal to the base electrode of said first transistor; a second driver stage including a second transistor of said one conductivity type and a third transistor of an opposite conductivity type, each having base, emitter, and collector electrodes; means for deriving a signal from the collector electrode of said first transistor and applying said signal to the base electrodes of said second and third transistors; an output stage including a fourth transistor of said one conductivity type and a fifth transistor of said opposite conductivity type, each having base, emitter, and collector electrodes; means for deriving a push-pull signal from the emitter electrodes of the transistors of said second driver stage and applying said push-pull signal to the base electrodes of said fourth and fifth transistor; a signal output circuit coupled with the emitter electrodes of said fourth and fifth transistors; and a stabilizing bias circuit connected between the emitter electrodes of said fourth and fifth transistors and the base electrode of said first transistor including a direct current conductive semi-conductor diode providing dynamic resistance in said bias circuit and a voltage drop in response to current flow therethrough having a magnitude in excess of the product of said current and said dynamic resistance, said bias circuit providing a bias current for the base electrode of said first transistor to stabilize the circuit operation of said signal amplifier circuit.

2. A signal amplifier circuit comprising, in combination, a first driver stage including a first transistor of one conductivity type having base, emitter, and collector electrodes; means for applying an input signal to the base electrode of said first transistor; a second driver stage including a second transistor of said one conductivity type and a third transistor of an opposite conductivity type, each having base, emitter, and collector electrodes; means direct-current-conductively connecting the collector of said first transistor with the base electrodes of said second and third transistors for applying an amplified signal to the base electrodes of said second and third transistors; an output stage including a fourth transistor of said one conductivity type and a fifth transistor of said opposite conductivity type, each having base, emitter, and collector electrodes; means direct-current-conductively connecting the emitter electrodes of said second and third transistors with the base electrodes of said fourth and fifth transistors for applying a push-pull signal from the emitter electrodes of the transistors of said second driver stage to the base electrodes of said fourth and fifth transistors; a signal output circuit coupled with the emitter electrodes of said fourth and fifth transistors; means providing a source of biasing potential including a pair of terminals; means connecting the collector electrodes of said first, second, and fourth transistors with one terminal of said source; means connecting the emitter electrode of said first transistor and the collector electrodes of said third and fifth transistors with the other terminal of said source; and a stabilizing bias circuit connected between the emitter electrodes of said fourth and fifth transistors and the base electrode of said first transistor including a direct current conductive Zenner diode, said bias circuit providing a bias current for the base electrode of said first transistor to stabilize the circuit operation of said signal amplifier circuit.

References Cited in the file of this patent

UNITED STATES PATENTS 2,751,446 Bopp ---------------- June 19, 1956

OTHER REFERENCES

Proceedings—Institute of Radio Engineers, June 1953, pages 717–724, Sziklai, "Symmetrical Properties of Transistors and Their Applications."

"Electronics" September 1953, pages 140–143, Lohman, "Complementary Symmetry."